United States Patent [19]

Cook et al.

[11] 4,434,478

[45] Feb. 28, 1984

[54] PROGRAMMING FLOATING GATE DEVICES

[75] Inventors: Herbert C. Cook, Georgia; Ronald R. Troutman, Essex Junction, both of Vt.

[73] Assignee: International Business Machines Corporation, Armonk, N.Y.

[21] Appl. No.: 325,479

[22] Filed: Nov. 27, 1981

[51] Int. Cl.$^3$ .............................................. G11C 11/40
[52] U.S. Cl. ..................................... 365/185; 365/104
[58] Field of Search ....................... 365/104, 182, 185; 357/23 VT, 45

[56] References Cited

U.S. PATENT DOCUMENTS

| | | | |
|---|---|---|---|
| 3,914,855 | 10/1974 | Cheney et al. | 29/571 |
| 4,055,837 | 10/1977 | Stein et al. | 340/173 R |
| 4,104,675 | 8/1978 | Dimaria et al. | 357/54 |
| 4,161,039 | 7/1979 | Rossler | 365/185 |
| 4,334,292 | 6/1982 | Kotecha | 365/182 |
| 4,336,603 | 6/1982 | Kotecha et al. | 365/182 |
| 4,366,555 | 12/1982 | Hu | 365/185 |
| 4,376,947 | 3/1983 | Chiu et al. | 365/185 X |

OTHER PUBLICATIONS

T. P. Cauge et al., Electronics, Feb. 15, 1971, "Double-diffused MOS Transistor Achieves Microwave Gain", pp. 99–104.

P. E. Cottrell et al., IEEE Journal of Solid-State Circuits, vol. SC-14, No. 2, Apr. 1979, "Hot-Electron Emission in N-Channel IGFET's ", pp. 442–455.

*Primary Examiner*—Joseph A. Popek
*Attorney, Agent, or Firm*—Stephen J. Limanek

[57] ABSTRACT

A memory system is provided wherein extended injection-limited programming techniques attain a substantially uniform programming behavior from an ensemble of fabricated devices or cells to provide the maximum obtainable voltage threshold shift within a minimum time period. In order to produce these desired results, a floating gate of a device is charged by applying to the control gate of the device a first voltage during a portion of this time period which produces an accelerating field in a dielectric layer disposed adjacent to the floating gate and then applying to the control gate during the remaining portion of this time period a second voltage of greater magnitude than that of the first voltage prior to or when the accumulation of charge on the floating gate causes a retarding field to be established in the dielectric layer.

17 Claims, 9 Drawing Figures

PROGRAMMING FLOATING GATE DEVICES

DESCRIPTION

Technical Field

This invention relates to integrated semiconductor circuits and more particularly to a technique for rapidly programming or selectively charging floating gate devices which may be used in, e.g., an electrically alterable read only memory (EAROM), a non-volatile random access memory, or an electrically alterable programmable logic array.

BACKGROUND ART

Integrated semiconductor circuits, particularly systems or arrays having transistors each of which represents a binary digit of information, as in read only memories (ROM), have achieved high device or cell densities.

In, e.g., U.S. Pat. No. 3,914,855, filed May 9, 1974, by G. T. Cheney et al, there is described a read only memory wherein the array has transistors made with a thin gate dielectric exhibiting a low threshold voltage for storing a "1" digit of binary information and transistors made of a thick gate dielectric exhibiting a considerably higher threshold voltage for storing the other digit of binary information. Also described is a read only memory wherein ion impurities are implanted to render selected devices inoperative, as defining a "1" digit of binary information, while the remaining devices are operative devices or transistors defining the other digit of binary information.

In U.S. Pat. No. 4,161,039, filed Feb. 6, 1978, by B. Rossler, there is disclosed a memory array utilizing field effect transistors (FET) where information is stored in floating gates and the channel region is made to a short length by employing double-diffusion processing techniques, as disclosed in more detail in "Electronics" Feb. 15, 1971, at pages 99-104. This memory is not a simple read only memory but one that can be reprogrammed after erasing the stored information with ultraviolet light.

U.S. Pat. No. 4,055,837, filed Oct. 22, 1975, by K. U. Stein et al, discloses a single transistor memory wherein information may be stored for long periods of time in a dual insulating structure which is made of silicon nitride formed on silicon dioxide.

Commonly assigned U.S. Pat. No. 4,104,675, filed June 21, 1977 by D. J. DiMaria et al discloses a nondestructive long-term storage system using a floating gate and a single graded energy band gap structure in which each cell may be driven by a relatively low voltage.

In commonly assigned U.S. patent applications Ser. No. 153,359 filed May 27, 1980 by H. N. Kotecha, now U.S. Pat. No. 4,334,292, and Ser No. 160,530 filed June 18, 1980 by H. N. Kotecha and F. W. Wiedman, now U.S. Pat. No. 4,336,603 there is disclosed an improved system for charging and discharging, or writing and erasing, a conductive plate with a charge injector controlled by low voltages. The conductive plate is a floating gate of a cell or transistor, which may be used in an array for storing for long periods of time, on the order of 10 years or more, binary digits of information representing a "0" or a "1" depending upon whether a charge is stored on the floating gate to alter the threshold voltage of the transistor. When using these cells in a memory array, information may be written into or erased from each of the cells individually or a blanket erase may be employed for the entire or a selected section of the array.

DISCLOSURE OF THE INVENTION

It is an object of this invention to more rapidly program a cell requiring charge transfer.

It is another object of this invention to more rapidly charge a floating gate of a transistor or memory cell.

It is yet another object of this invention to provide an improved memory system wherein a more rapid charge of a floating gate results in a higher density array with higher yield.

Still another object of this invention is to improve the programming uniformity within a given chip and from chip to chip by providing a multiplicity of optimum control gate voltages matched to the multiplicity of device programming characteristics.

In accordance with the teachings of this invention, an improved memory system is provided by employing extending injection-limited programming techniques which attain a substantially uniform programming behavior from an ensemble of fabricated devices or cells to provide the maximum obtainable voltage threshold shift within a minimum time period. In order to produce these desired results, a floating gate of a device is charged by applying to the control gate of the device a first voltage during a portion of this time period which produces an accelerating field in a dielectric layer disposed adjacent to the floating gate and then applying to the control gate during the remaining portion of this time period a second voltage of greater magnitude than that of the first voltage prior to or when the accumulation of charge on the floating gate causes a retarding field to be established in the dielectric layer.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
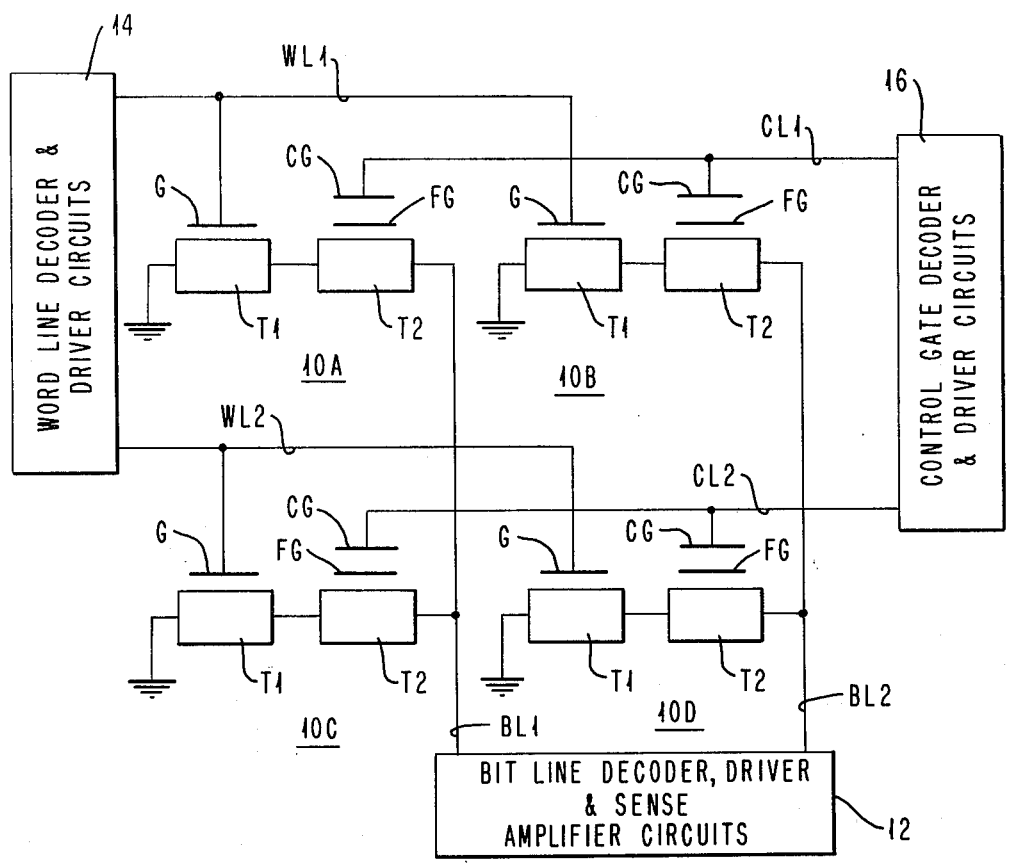
FIG. 1 illustrates a memory system of the present invention in the form of an electrically programmable read only memory having two devices or transistors per cell.

Referring to FIG. 1 of the drawings in more detail, there is illustrated an embodiment of a memory system which can be operated in accordance with the teachings of the present invention. The system includes an array of memory cells 10A, 10B, 10C and 10D, each of which includes a first transistor T1 and a second transistor T2. Each of the first transistors T1 includes a gate electrode G and each of the second transistors T2 includes a control gate CG and a floating gate FG. The first transistor T1 and the second transistor T2 of the cell 10A are serially connected to bit line decoder, driver and sense amplifier circuits 12 through a first bit/sense line BL1, and the first and second transistors T1 and T2 of the cell 10C are also serially connected to bit line decoder, driver and sense amplifier circuits 12 through the first bit/sense line BL1. The first and second transistors T1 and T2 of the cell 10B are serially connected to the bit line decoder, driver and sense amplifier circuits 12 through a second bit/sense line BL2, and the first and second transistors T1 and T2 of the cell 10D are also serially connected to the bit line decoder, drive and sense amplifier circuits 12 through the second bit/sense line BL2. The gate electrodes G of the first transistor T1 of the memory cells 10A and 10B are connected to word line decoder and driver circuits 14 through a first word line WL1 and the gate electrodes G of the first transistor T1 of the cells 10C and 10D are connected to the word line decoder and driver circuits 14 through a second word line WL2. Bit line decoder, driver and sense amplifier circuits 12 and word line decoder and driver circuits 14 may be of any conventional type. The control gates CG of the second transistors T2 of the cells 10A and 10B are connected to control gate decoder and driver circuits 16 through a first control line CL1, and the control gates CG of the second transistor T2 of the cells 10C and 10D are connected to the control gate decoder and driver circuits 16 through a second control line CL2. The decoder portion of the circuits 16 may be of any conventional type, or may be eliminated, if desired, but the driver circuit of circuits 16 are required and will be described hereinbelow in detail.

Figure 2:
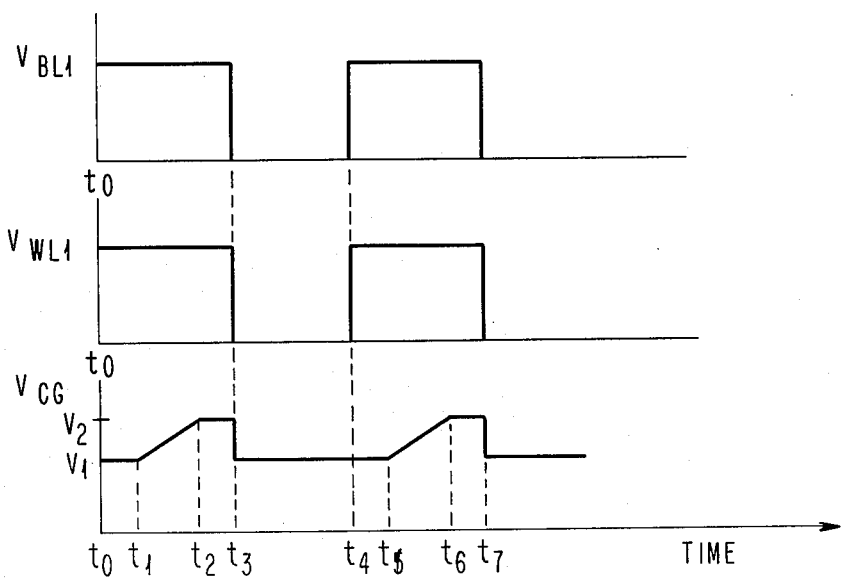
FIG. 2 is a pulse program having a specially shaped control gate voltage in accordance with the teachings of the present invention which may be used to operate the system illustrated in FIG. 1 of the drawings during programming.

FIG. 2 illustrates a pulse program of the present invention which may be used to write information into the system shown in FIG. 1 of the drawings. In the operation of the system of FIG. 1, to write a 1 digit of binary information in, e.g., cell 10A, at time $t_0$ a pulse $V_{BL1}$ of typically +11 volts is applied to the first bit/sense line BL1 from bit line decoder, driver and sense amplifier circuits 12, with line BL2 at ground, and a pulse $V_{WL1}$ of typically +10 volts is applied to the first word line WL1, with line WL2 at ground, while a specially shaped pulse $V_{CG}$ of magnitude, $V_1$, e.g., +20 volts, is applied to the control gate CG of the second transistor T2 of the cell 10A. At time $t_1$, e.g., approximately 0.1 $T_W$, where $T_W$ may be in the range of 10-100 milliseconds, after $t_0$, the voltage $V_{CG}$ begins to increase at a rate to be described hereinbelow until at time $t_2$, e.g., 0.9 $T_W$ after $t_0$, it reaches a magnitude $V_2$, e.g., +24 volts. At time $t_3$, which is approximately 0.1 $T_W$ millisecond after $t_2$, all voltages may be lowered to zero potential or to ground, except that, if desired, the pulse $V_{CG}$ may be decreased to only $V_1$. During the time period from $t_0$ to $t_1$ current flows rapidly to the floating gate FG of the cell 10A while an accelerating field exists in a dielectric medium located below the floating gate FG. As charge builds up on the floating gate FG the accelerating field decreases until a retarding field is established in the dielectric medium which causes a decrease in the current or rate of flow of electrons to the floating gate FG. By increasing the voltage at time $t_1$ at a rate R which is equal to approximately the maximum current flow to the floating gate divided by the capacitance between the floating and control gates FG and CG, respectively, the accelerating field becomes reestablished and the rate of current is maintained at a high value until a charge is produced on the floating gate FG of the cell 10A which results in an increase in threshold voltage of the transistor T2 to the desired magnitude in the shortest possible interval of time. The necessary waveforms for producing this desired result will be described hereinbelow in more detail. If desired, an entire word line of cells, e.g., cells 10A and 10B, may be written simultaneously by applying a positive voltage to the bit/sense lines BL1 and BL2 for storing a 1 digit of binary information and a zero voltage to the bit/sense lines BL1 and BL2 for storing a 0 digit of information. Furthermore, if desired, between time periods $t_0$ and $t_3$, cells of a first block may be written simultaneously and between time periods $t_4$ and $t_7$, as indicated in FIG. 2 of the drawings, cells of a second block may be written simultaneously.

It can be seen that when readng information from cells 10A, 10B, 10C and 10D, with, e.g., +5 volts applied to the selected word line WL and +5 volts on the corresponding control line CL, current flows through transistors T1 and T2 of a selected cell if its floating gate FG does not have a negative charge stored therein, and current does not flow to bit line decoder, driver and sense amplifier 12 if its floating gate FG has a sufficiently large negative charge stored therein to keep transistor T2 turned off.

It should be noted that an advantage to using the system of FIG. 1 which has two devices per cell is that the drive circuit portion of circuits 16 can generate a high voltage off chip which permits greater wave shaping flexibility and voltage levels exceeding the diffusion breakdown voltages of the array's chip.

Figure 3:
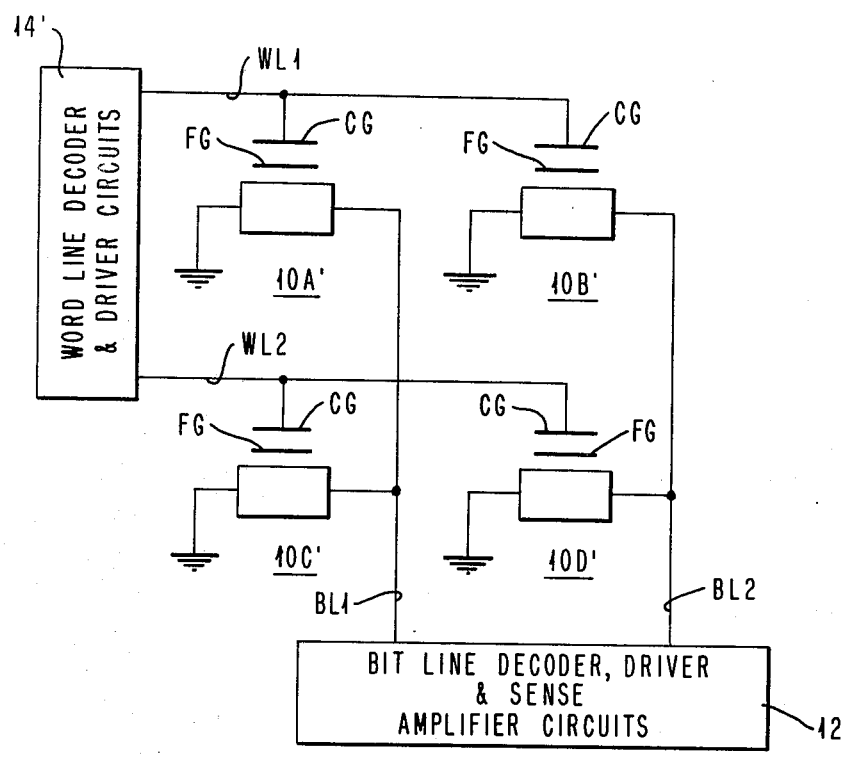
FIG. 3 illustrates a memory system of the present invention in the form of an electrically programmable read only memory having one device or transistor per cell.

To provide a system with a denser array of electrically programmable read only memory cells, each cell may use only a single device or transistor, as illustrated in FIG. 3 of the drawings. This system is similar to that of FIG. 1 except that the first transistor T1 has been eliminated from each of the cells 10A, 10B, 10C and 10D of FIG. 1 to form single transistor cells 10A', 10B', 10C' and 10D' of FIG. 3., and word line decoder and driver circuits 14 of FIG. 1 has been modified to include the control gate driver circuit of circuits 16 in FIG. 1 forming the word line decoder and driver circuits 14' of FIG. 3. Bit line decoder, driver and sense amplifier circuits 12 of FIG. 3 may be similar to the corresponding circuits 12 in FIG. 1. The system of FIG. 3 has all the advantages of the system of FIG. 1 except that the control gate driver circuit voltages must be generated on the array's chip and, therefore, the levels of the driver circuit voltages must not exceed diffusion breakdown voltages of the array's chip.

The system of FIG. 3 operates in a manner similar to that of the system of FIG. 1 except that the voltage $V_{CG}$ of FIG. 2 is selectively applied to the word lines WL1 and WL2 of FIG. 3, which eliminates the need for voltage $V_{WL1}$ of FIG. 2. Unselected word lines are held at ground.

Figure 4:
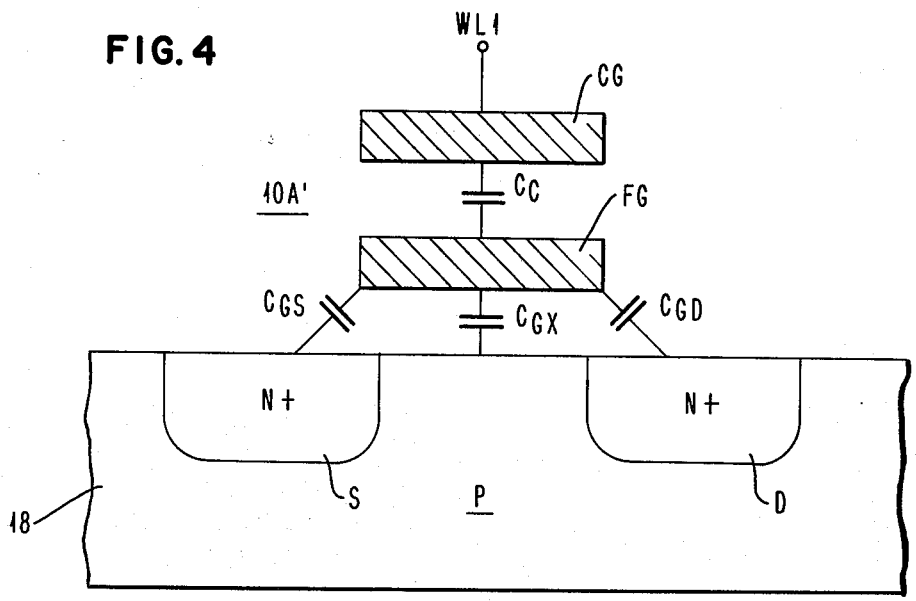
FIG. 4 illustrates a cross-sectional view of one of the transistors or cells shown in FIG. 3 of the drawings.

To better understand the voltage waveform required for the control gates CG of cells 10A, 10B, 10C and 10D of FIG. 1 and of cells 10A', 10B', 10C' and 10D' of FIG. 3 to charge their associated floating gates in a minimum amount of time, a more detailed analysis of a floating gate memory cell is herein provided. As illustrated in FIG. 4 of the drawings, which is a cross-sectional view of cell 10A' of FIG. 3, spaced apart source S and drain D in a P-type silicon substrate 18 and the floating gate FG form a capacitor $C_{GX}$ between the floating gate FG and the substrate 18, a capacitor $C_{GS}$ between the floating gate FG and the source S and a capacitor $C_{GD}$ between the floating gate FG and the drain D. A capacitor $C_C$ is formed between the floating gate FG and the control gate CG. Accordingly, a voltage $V_{CG}$ applied to the control gate CG produces an initial floating gate voltage $V_{FG}=\chi V_{CG}$, assuming zero initial charge on the floating gate FG, where the capacitive coupling factor $\chi = C_C/(C_C+C_{GS}+C_{GX}+C_{GD})$.

Figure 5:
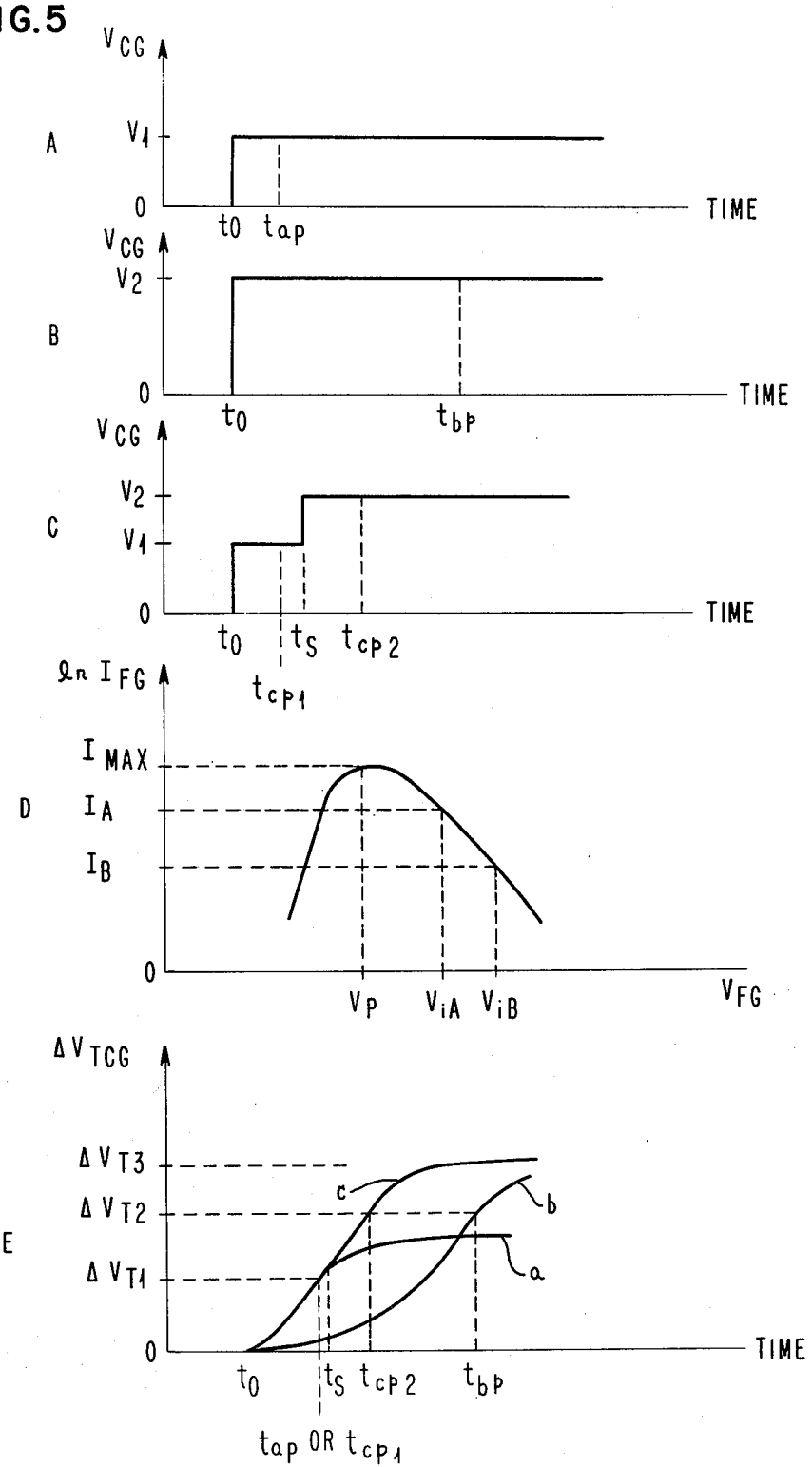
FIG. 5 is a series of graphs indicating voltage and time and voltage and current relationships during programming in the transistor or cell shown in FIG. 4 of the drawings.

Graphs A, B and C of FIG. 5 of the drawings illustrate various waveforms and voltage magnitudes which may be applied to the control gate CG of FIG. 4. Graph D of FIG. 5 depicts the channel hot electron injection characteristics of the floating gate FG with the charging current $I_{FG}$ of the floating gate FG resulting from the emission of hot electrons near the drain of the device, plotted in log form against the floating gate voltage $V_{FG}$, in the manner discussed in IEEE Journal of Solid-State Circuits, Vol. SC-14, No. 2, April 1979, pp. 442–455, in "Hot-Electron Emission in N-Channel IGFETS" by P. E. Cottrell, R. R. Troutman and T. H. Ning. As can be seen from the curve in graph D, current or electron flow to the floating gate FG is dependent upon the voltage $V_{FG}$ on the floating gate FG. The maximum current flow occurs at a peak voltage $V_P$. For a floating gate voltage $V_{FG}$ greater than $V_P$, an accelerating field is created in the dielectric or oxide layer adjacent to the floating gate FG within which current is injection limited. For a floating gate voltage $V_{FG}$ less than $V_P$, a retarding field is established in the dielectric layer within which current is field limited. As charge accummulates on the floating gate FG, the threshold voltage measured at the control gate of the device shifts as indicated by the curves in graph E of FIG. 5.

Referring to the graphs in FIG. 5 in more detail, when a voltage $V_1$ of, say, 20 volts is applied to the control gate CG, the voltage on the floating gate FG is $V_{iA}$, which is initially equal to $\chi V_1$, where $\chi$ is the control gate to floating gate capacitive coupling factor. The floating gate voltage $V_{iA}$ produces a significant, initial floating gate current flow $I_A$, as indicated along the negative slope in graph D of FIG. 5. As current flows onto the floating gate FG, the voltage on the floating gate FG decreases until it reaches a floating gate voltage $V_P$, at which maximum current $I_{MAX}$ flows to the floating gate FG and the ln $I_{FG}$ curve has a zero slope. As charge current $I_{FG}$ continues to flow to the floating gate FG, the voltage $V_{FG}$ continues to fall but now, in the field limited region which has a positive slope, it falls within a rapid decrease in the flow of current $I_{FG}$. By referring to curve a in graph E of FIG. 5, it can be seen that after time $t_0$ when the voltage $V_1$ has been applied to the control gate CG, the threshold voltage shift $\Delta V_{TCG}$ of the device illustrated in FIG. 4 begins to increase rapidly with maximum acceleration taking place at time $t_{ap}$ which corresponds to the time at which the floating gate voltage $V_{FG}$ is at voltage $V_P$. At time $t_{ap}$ the threshold voltage shift is equal to $\Delta V_{T1}$. Shortly after time $t_{ap}$, the rate of increase of the threshold voltage begins to rapidly slow down. Accordingly, at this point, the charging of the floating gate FG at the condition set by voltage $V_1$ is substantially complete.

If a voltage $V_2$ greater than $V_1$, e.g., 24 volts, is applied to the control gate CG, the initial voltage on the floating gate FG becomes $V_{iB}$ which is equal to $\chi V_2$. The floating gate voltage $V_{iB}$ produces a floating gate current flow $I_B$ which is significantly smaller than the flow produced by floating gate voltage $V_{iA}$, as indicated in the graph D of FIG. 5. Again, charge current will continue to flow at an increasing rate into the floating gate FG until the voltage on the floating gate FG reaches the voltage $V_P$ and the current $I_{MAX}$. As the floating gate voltage $V_{FG}$ decreases below the value $V_P$, the floating gate current again decreases rapidly. By referring to curve b in graph E of FIG. 5, it can be seen that after time $t_0$ when the voltage $V_2$ has been applied to the control gate CG, the threshold voltage shift $\Delta V_{TCG}$ of the device illustrated in FIG. 4 begins to increase more slowly than it did when the control gate voltage $V_1$ was applied to control gate CG, as indicated by the difference in the slopes between curves a and b in the graph E of FIG. 5, with maximum acceleration occurring along curve b at time $t_{bp}$ which corresponds to the time at which the floating gate voltage $V_{FG}$ is at $V_P$ with voltage $V_2$ applied to the control gate CG. Unfortunately, the time between $t_0$ and $t_{bp}$ may already exceed by an order of magnitude or more the total time $T_W$ allowed for writing. Shortly after time $t_{bp}$, the rate of increase of the threshold voltage begins to rapidly slow down. Accordingly, at this point the floating gate FG is substantially fully charged by the control gate voltage $V_2$. It should be noted, that by applying the smaller voltage $V_1$ the threshold voltage shifts to a given value, e.g., $\Delta V_{T1}$, sooner than the larger voltage $V_2$, however, the magnitude of the threshold voltage shift may ultimately be considerably greater, i.e., $\Delta V_{T3}$, with the voltage $V_2$ applied to the control gate CG.

In accordance with the teachings of this invention, the threshold voltage of the device of FIG. 4 is shifted by a large amount within a short period of time by first applying to the control gate CG the voltage $V_1$ until the voltage on the floating gate reaches the value $V_P$, e.g., within approximately 30 milliseconds, and thereafter, within, say, 10 milliseconds, increasing the voltage on the control gate CG to the value $V_2$, thus extending the time in which the floating gate current is near $I_{MAX}$ in its injection limited region. By referring to curve c in graph E of FIG. 5, it can be seen that after time $t_0$ when the voltage $V_1$ has been applied to the control gate CG, the threshold voltage shift $\Delta V_{TCG}$ of the device illustrated in FIG. 4 begins to increase rapidly with maximum acceleration occurring at time $t_{cp1}$, or $t_{ap}$, as described hereinabove. At time $t_{cp1}$ or $t_{ap}$, or shortly thereafter, e.g., within 10 milliseconds at time $t_S$, the voltage is increased at the control gate to $V_2$. Since at this time a charge has already been produced on the floating gate FG and the threshold voltage shift is at least $\Delta V_{T1}$, the threshold voltage shift continues to increase at a rapid rate, with another maximum acceleration occurring at time $t_{cp2}$, as indicated by curve c in graph E of FIG. 5, rather than at the slow rate indicated by curve b at times $t_{ap}$ or $t_S$. Accordingly, by shifting the threshold voltage as indicated by curve c, two maximum shifting rates are provided and the floating gate FG becomes charged in a very short period of time which may produce a threshold voltage shift of 7 volts within 100 milliseconds with a maximum device channel length of 3 microns and a $\chi = 0.62$.

Figure 6:
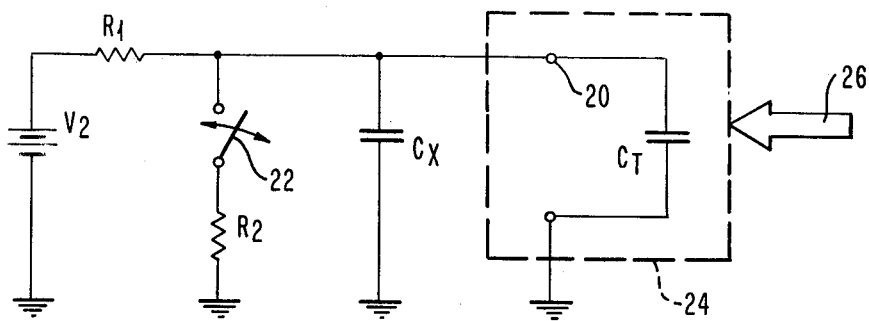
FIG. 6 is a circuit diagram of a control gate driver which may be used to produce the control gate voltage for operating the system of the present invention, FIG. 7 indicates the voltage wave form produced by the circuit diagram illustrated in FIG. 6 of the drawings.

Although a stepped voltage as indicated in FIG. 5 at graph C may be used in the practice of this invention, if desired, a multiply stepped or a continuously increasing voltage from $V_1$ to $V_2$, such as a linear or exponential ramp, may also be applied to the control gates CG of the devices of the system of the present invention. More specifically, a control gate driver circuit, as illustrated in FIG. 6 of the drawings may be provided off chip for the two device per cell system of FIG. 1 to produce the ramped voltage shown in FIG. 7 of the drawings which may be applied to a control gate pin or pad of the array chip as indicated at reference number 20 in FIG. 6. By proper choice of the component values shown in FIG. 6, the ramp rate can be adjusted to provide the desired shift in control gate voltage from $V_1$ to $V_2$ during the allotted write time $T_W$. The driver circuit of FIG. 6 includes first and second serially connected resistors $R_1$ and $R_2$ having switching means 22 interposed therebetween. The switching means 22 is arranged to open and close at a frequency f equal to $1/(T_W + T_D)$, where the write time $T_W$ is the time during which the switching means 22 is opened and $T_D$ is the time during which the switching means 22 is closed. One end of the serially connected resistors $R_1$, $R_2$ is connected to the positive terminal of a voltage source $V_2$ of, e.g., +24 volts and the other end of the serially connected resistors $R_1$, $R_2$ is connected to the other terminal of the voltage source $V_2$, which is at ground potential. The control gate pin 20 is connected to the positive terminal of the voltage source $V_2$ through the first resistor $R_1$. A padding capacitor $C_X$ is connected between the control gate pin 20 and ground potential. Capacitor $C_T$ shown connected between the control gate pin 20 and ground potential represents the total capacitance of N control gates and associated wiring on the array of a chip, indicated in dashed lines at 24, connected to the control gate pin 20, where N equals M/P with M being equal to the total number of bits or cells on the chip and P being equal to the number of control gate pins. Partitioning of the array into blocks may be employed for reliability considerations or when redundancy techniques are employed on the chip. The values of the first and second resistors $R_1$ and $R_2$ and the padding capacitor $C_X$ are chosen to optimize the programming of the array cells. Of course, each chip 24 is provided with appropriate address pulses in a known manner to select the bits or cells to be programmed, as indicated at 26.

Figure 7:
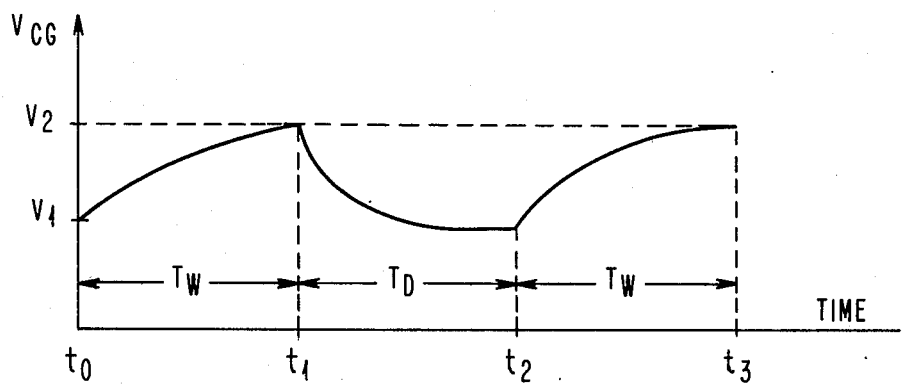

As illustrated in the graph of FIG. 7 of the drawings, the time to write into a first block of cells in an array is equal to $T_W$, during which time the switching means 22 is open and the voltage source $V_2$ is charging up capacitors $C_X$ and $C_T$ connected to the gate control pin 20. The ratio of the voltages $V_1/V_2$ is equal to $R_2/(R_1+R_2)$, with voltage $V_1$ being the initial voltage applied to the control gates CG during the write period, as described hereinabove in connection with the graphs of FIG. 5. When $T_W \gtrsim 3Y_0$, wherein $Y_0$ is equal to $R_1(C_X+C_T)$ and is the circuit time constant with switching means 22 open, then for time t such that $t_0 \leq t \leq t_1$, the control gate voltage is $$V_{CG}(t) = V_2\{R_2 + R_1(1 - e^{-(t-t_0)/Y_0})\}/(R_1+R_2),$$

while for time t such that $t_1 \leq t \leq t_2$, when switching means 22 is closed $$V_{CG}(t) = V_2\{R_2 + R_1 e^{-(t-t_1)/Y_c}\}/(R_1+R_2),$$

where $Y_c = R_2 Y_0/(R_1+R_2)$.

During the time period $t_1 \leq t \leq t_2$, the switching means 22 is closed and the voltage on pin 20 drops to $V_1$. During time period $t_2 \leq t \leq t_3$, a second block of cells may be written.

Figure 8:
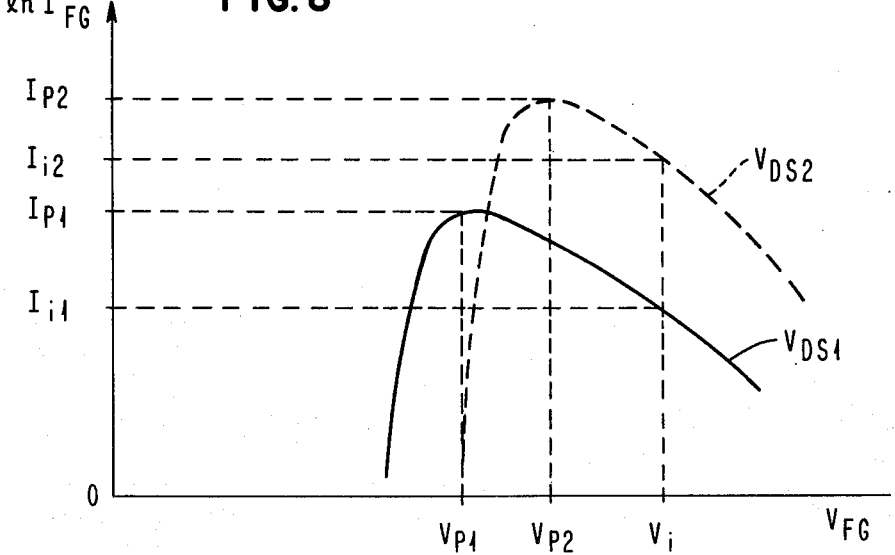
FIG. 8 indicates floating gate voltage and floating gate current characteristics for two different values of source to drain voltages of a transistor.

It should be noted, as indicated in the graph of FIG. 8 of the drawings, that the channel hot electron emission or injection characteristic of a cell, as shown, e.g., in FIG. 4 of the drawings, varies with the voltage applied between the drain D and source S of the cell. The graph of FIG. 8 is a plot of the voltage $V_{FG}$ on the floating gate FG as a function of the channel hot electron current $I_{FG}$ collected on the floating gate FG, indicated substantially exponentially. The curve $V_{DS1}$ is shown having an initial floating gate current flow of $I_{i1}$, when an initial voltage of $V_i$ is applied to the control gate CG with a drain-to-source voltage of $V_{DS1}$ volts, and a peak floating gate current $I_{P1}$ when the floating gate voltage is a $V_{P1}$. When the drain-to-source voltage is increased to $V_{DS2}$, the initial voltage of $V_i$ produces an initial higher flow of floating gate current of $I_{i2}$ with the peak floating gate current $I_{P2}$ occurring at a higher floating gate voltage $V_{P2}$, as indicated in the curve $V_{DS2}$ of FIG. 8 of the drawings. The floating gate voltage at which peak charge current is produced is approximately linearly dependent on the drain-to-source voltage of the device or cell being programmed. Accordingly, it can be seen that by selecting a desired writing time period $T_W$, a desired shift in the threshold voltage of a cell having given parameters may be obtained by selecting an appropriate initial control gate voltage to provide a floating gate voltage falling within the injection limited region of the device or cell and then effectively extending the time during which the cell is in the injection limited region by increasing the control gate voltage $V_{CG}$ in appropriate steps or in a ramp fashion.

The shape of the control gate wave form can be used to match a multiplicity of optimum control gate voltages $V_{CG}$ to the multiplicity of device programming characteristics for the many thousands of memory cells on a chip. This can be made clearer by considering the following examples of increasing complexity.

As an illustration, consider the optimum condition for writing if all devices on the chip are identical. We then use a linear ramp from $V_1$ to $V_2$ and adjust the ramp rate R to balance the channel hot electron emission current with the time-invariant displacement current over the write time $T_W$. When all devices are identical, the optimum condition is to choose $V_1$ such that $\chi V_1 = V_p$ and to choose $R = I_{MAX}/C_C$. This insures a constant current to the floating gate of $I_{MAX}$ over the write time $T_W$ and results in the threshold shift $\Delta V_{TCG} = I_{MAX} T_W/C_C$.

In practice, one chooses $V_{DS}$ large enough to guarantee $I_{MAX}$ high enough to accomplish the required threshold shift within the allotted time $T_W$.

Figure 9:
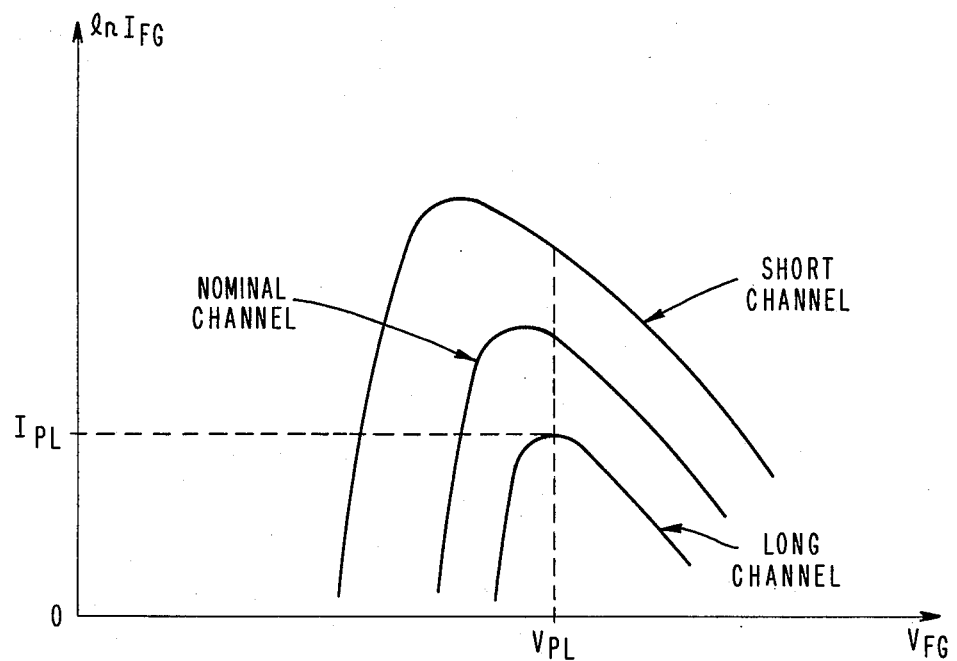
FIG. 9 indicates floating gate voltage and floating gate current characteristics for several different transistor channel lengths.

However, not all devices on the chip are identical. A large excursion in writing characteristics results from channel length variations alone. This is shown in FIG. 9 of the drawings where three $I_{FG}$ vs. $V_{FG}$ characteristics are represented in log fashion. The middle curve represents the characteristic for the nominal channel length, the upper curve represents the worst case short channel length, resulting from process variations, and the lower curve represents the worst case long channel length. All devices in the ensemble have a characteristic between the upper and lower curves.

The optimum writing conditions described for the case of all devices being identical can be extended by choosing $V_1$ such that $\chi V_1 = V_{PL}$, the location of the peak current for the longest channel device, as indicated in FIG. 9, the ramp rate $R = I_{PL}/C_C$. This insures a constant current $I_{PL}$ to the floating gate device with the longest channel over the write time $T_W$ and results in the threshold shift $$\Delta V_{TCG} = I_{PL} T_W / C_C.$$

As can be seen from FIG. 9, the current for all other devices is higher than that for the longest channel so that they are written even faster. The threshold shift described above for the longest channel is, therefore, the minimum threshold shift in the ensemble.

In addition to channel length, there are many other factors affecting the initial current to the floating gate. These include variations in the cells' finished dimensions, both vertical and horizontal, which affect the value of $\chi$, and variations in the power supply voltage, which affect the value of $V_2$. For the actual design case then, the condition for $V_i$ discussed above, namely $$V_i = \chi \frac{R_2 V_2}{R_1 + R_2}$$

describes a distribution of values $V_i$ across the ensemble of cells on the chip. Because of the range of values for $\chi$ and $V_2$, the values of $V_i$ will fall in the range of $V_{i,LO}$ to $V_{i,HI}$ and have some nominal value $V_{i,NOM}$.

For any one particular $\ln I_{FG}$ vs $V_{FG}$ characteristic curve, effective and efficient programming can be practically defined as any current greater than approximately $0.1\ I_{MAX}$, where $I_{MAX}$ is indicated in FIG. 5. Since charging of the floating gate FG moves $V_{FG}$ to lower values, and since there is a greater excursion of floating gate voltage $V_{FG}$ in the injection limited region for currents above $0.1\ I_{MAX}$ it is clear that the initial programming conditions for the actual, non-ideal case should be chosen to the right of voltage $V_p$. This condition insures an excursion towards and through $I_{MAX}$, providing adequate programming charge, as long as the ramp rate is chosen so the initial displacement current is less than or equal to the initial hot electron current to the floating gate. Because of the range of values for $V_i$, the nominal $V_i$ is chosen to be sufficiently greater than $V_p$ to insure that substantially all the range exceeds $V_p$, or $V_{i,LO} \geq V_p$. Therefore, the first condition on the starting point for writing is, namely, $$\frac{R_2}{R_1 + R_2} V_2 = V_1 = \frac{V_{i,NOM}}{\chi_{NOM}} - \frac{\Delta QE}{C_C} \quad (C1)$$

where $\Delta QE$ is the net positive charge left on the floating gate as a result of the last erasure cycle. Its value depends on the type of erasure mechanism used, i.e., ultraviolet radiation in the case of an electrically programmable read only memory (EPROM) and avalanche injection of holes or tunnel erasure for an electrically erasable programmable read only memory (EE-PROM). The second condition on the starting point can be written from the discussion above as $$V_{i,NOM} > V_p$$

and substituting from (C1) this condition becomes $$\chi_{NOM} \left( \frac{R_2}{R_1 + R_2} V_2 + \frac{\Delta QE}{C_C} \right) > V_p \text{ or} \quad (C2)$$

$$V_{2,NOM} > \left( 1 + \frac{R_1}{R_2} \right) \left( \frac{V_p}{\chi_{NOM}} - \frac{\Delta QE}{C_C} \right).$$

The condition on the ramp rate can be written by noting that the initial displacement current resulting from the control gate ramping should be less than or equal to the initial hot electron current $I_i$. Using the equations above for $V_{CG}(t)$, this becomes $$\frac{C_C V_2}{(R_1 + R_2)(C_x + C_T)} \leq I_i \quad (C3)$$

which is the ramp rate condition for the specific embodiment under discussion.

With $R_1$ chosen from the condition that $$T_W \geq 3\tau_O \text{ or } T_W \geq 3 \left( 1 + \frac{C_T}{C_X} \right) C_X R_1, \quad (C4)$$

the padding capacitor $C_X$ is provided to increase the rise time control due to chip-to-chip variations in the total capacitance $C_T$ connected to the control gate pin 20. Since $C_X$ and $C_T$ are both known, condition (C4) fixes $R_1$ once the write time $T_W$ is chosen.

The next step in the determination of the values for $R_1$, $R_2$, $V_1$ and $V_2$ is to choose a trial value of $V_2$ and calculate the resulting $R_2$ from condition (C3). Then condition (C2) is checked for validity. If (C2) is not satisfied, a higher value of $V_2$ is chosen until both (C2) and (C3) are satisfied. Both $R_2$ and $V_2$ are now determined. Finally the value of $V_1$ is found from condition (C1).

In practice, the time allotted to program an EPROM cell, $T_W$, is a system parameter chosen for worst case write conditions consistant with overall performance. Under near optimum conditions, an individual cell will program in a time $t_p$ significantly shorter than $T_W$. In concept, then, if near ideal conditions for each cell in the ensemble can be provided for some minimum period of time, e.g., $T_m$, during the system write cycle $T_W$, then all cells will experience successful threshold shifts, $\Delta V_{FG} \geq \Delta V_{FGmin}$.

This very condition is provided by heretofore described increase in $V_{CG}$ during $T_W$. For some period $T_m$, each cell experiences injection conditions near $I_{MAX}$ for a sufficient time to insure $\Delta V_{FG} \geq \Delta V_{FGmin}$.

If a residual positive charge, due to a preceeding erase cycle for an EEPROM, resides on the floating gate FG, the optimum $V_{CG}$ required for this cell would shift to less positive values. Thus, a static, prederived value of $V_{CG}$ may not result in successful programming. However, the heretofore described increases in $V_{CG}$ during $T_W$ would provide near ideal programming conditions for this device in a similar manner as above.

Although only stepped voltage and ramped voltage waveforms have been disclosed hereinabove as being applied to the control gates of the cells in accordance with the teachings of this invention, it should be understood that other types of voltage waveforms, e.g., a sinusoidal voltage superimposed on a direct current (DC) voltage level, may be employed so long as the initial voltage produced on the floating gate CG is in the injection limited region of the $I_{FG}$ vs. $V_{FG}$ curve of the device or cell near the zero slope thereof and the voltage on the control gate FG is thereafter increased at a rate substantially equal to the decrease in the floating gate voltage caused by charging accumulation on the floating gate divided by the capacitance coupling factor. In a simpler aspect, the rate of increase R on the control gate CG may be equal to the charge current to the floating gate divided by the capacitance between the control gate CG and the floating gate FG.

It should also be understood that charge current for the floating gate FG need not originate from hot electron emission but may also have its source in, e.g., a charge injector of the type disclosed in the above-referenced Kotecha and Kotecha et al U.S. patent applications. In the cases where the charge to the floating gate is provided by a tunneling mechanism, there is no peak similar to $V_P$ in the ln $I_{FG}$ vs. $V_{FG}$ curves as shown in FIG. 5 for channel hot electron writing. Instead of the peak voltage $V_p$, the critical floating gate voltage $V_C$ is now defined by the insulator breakdown. For floating gates voltages exceeding $V_C$ there is a high probability of a catastrophic failure. Thus, the desired operating point is as near $V_C$ as possible to provide the higher current for the floating gate. The teaching described above for either stepping or ramping the control gate voltage is then applied to the tunneling mechanisms as well.

For a staircase waveform of N steps, the control gate voltage $V_{CG}$ is held constant at voltage $V_1$ for a time long enough to permit decoding and addressing all cells to be programmed. This time includes a time Y that drain voltage is applied to a decoded cell, but the time Y is not long enough to fully program the cell. After all cells have been partially programmed, the staircase is incremented to the voltage $V_2$. Again, all cells to be programmed are decoded and programmed to time Y. At the end of the staircase, all bits have seen a total programming time NY, which is chosen long enough to accomplish the desired threshold voltage shift.

When using a ramp waveform, the control gate voltage $V_{CG}$ is slowly time varying so that it changes only slightly in the time to decode all the cells to be programmed. In this manner, each cell sees an increasing control gate voltage as programming proceeds.

Accordingly, it can be seen that in accordance with the teachings of this invention, faster programming of a read only memory array is provided along with a tighter distribution of threshold shift over many thousands of cells, e.g., 36,000, in an array of an EPROM or an EEPROM. Because of the reduced over-programming, greater endurance of the EPROM or EEPROM is obtained, particularly when the time-varying voltage applied to the control gate of the cells is optimized for the cell having the longest channel length, which may be, e.g., 3 microns.

While the invention has been particularly shown and described with reference to preferred embodiments thereof, it will be understood by those skilled in the art that various changes in form and details may be made therein without departing from the spirit and scope of the invention.

What is claimed is:

1. A memory cell comprising
   a device having a control gate, an electrically floating gate, a capacitor formed between said control and floating gates having a given capacitance value and a source of charges, said floating gate exhibiting a charge current-voltage characteristic curve having a positive slope portion in a low voltage range, a negative slope portion in a voltage range higher than said low voltage range and a zero slope portion intermediate said positive and negative slope portions,
   means for applying during a first time period of a given time cycle a first voltage to said control gate to transfer charge from said source to said floating gate to produce a given initial voltage on said floating gate having a magnitude falling within the voltages of said negative slope portion in the vicinity of said zero slope portion,
   means for applying during a second time period subsequent to said first time period in said given time cycle a second voltage having a magnitude greater than said first voltage to said control gate to increase the voltage on said floating gate to a magnitude within said negative slope portion.

2. A memory cell as set forth in claim 1 wherein said second voltage applying means applies a ramp voltage to said control gate during said second time period.

3. A memory cell as set forth in claim 2 wherein said ramp voltage increases at a given rate substantially equal to current flow to said floating gate divided by the given capacitance value of said capacitor.

4. A memory cell as set forth in claim 1 wherein said source of charges is a source of hot electrons.

5. A memory cell comprising
   a device having a control gate, an electrically floating gate insulated from said control gate and a source of electrons, said floating gate exhibiting a charge current-voltage characteristic curve having a positive slope portion at low voltages, a negative slope portion at voltages higher than said low voltages and a zero slope portion at a given voltage producing a given current flow to said floating gate, said zero slope portion being interposed between said positive and negative slope portions,
   means for applying during a first time period of a given time cycle a first voltage to said control gate producing substantially said given voltage on said floating gate to charge said floating gate with said electrons, and
   means for applying during a second time period of said given time cycle a second voltage having a magnitude greater than that of said first voltage to said control gate producing again on said charged floating gate substantially said given voltage.

6. A memory cell as set forth in claim 5 wherein said first and second voltage applying means apply voltages sequentially to said control gate producing voltages on said floating gate located within the negative slope portion of said characteristic curve.

7. A memory cell as set forth in claim 6 wherein said source of electrons is a source of hot electrons.

8. A memory cell comprising
   a semiconductor substrate having spaced apart source and drain regions,
   a control gate, a floating gate insulated from said control gate and from said substrate so as form a capacitive coupling factor which is equal to $C_C/(C_C+C_{GX}+C_{GS}+C_{CD})$, wherein $C_C$ is the capacitance value of the capacitor formed between said floating gate and said control gate, $C_{GX}$ is the capacitance value of the capacitor formed between said floating gate and said substrate, $C_{GS}$ is the capacitance value of the capacitor formed between said floating gate and said source region and $C_{GD}$ is the capacitance value of the capacitor formed between said floating gate and said drain region, said floating gate having a floating gate voltage-current characteristic wherein said current is maximum at a given floating gate voltage, means for applying a voltage to said control gate providing substantially said given voltage to said floating gate, and means for increasing said control gate voltage at a rate substantially equal to the decrease in voltage on said floating gate caused by current flow to said floating gate divided by said capacitive coupling factor.

9. A memory cell comprising
a semiconductor substrate,
a source of electrons,
a transistor having a control gate,
a floating gate insulated from said control gate and from said substrate and forming a given capacitive coupling factor therewith, said floating gate having a floating gate voltage-current characteristic wherein current flow to said floating gate is substantially at a maximum when said floating gate has a given voltage, means for applying during a first time period of a given time cycle a voltage to said control gate producing substantially said given voltage at said floating gate to draw current to said floating gate from said source, and means for increasing said control gate voltage during a second time period of said time cycle at a rate substantially equal to the decrease in voltage on said floating gate caused by current flow to said floating gate divided by said given capacitive coupling factor.

10. A memory cell comprising;
a transistor formed in a substrate having a control gate, a floating gate and a drain,
means for injecting channel hot electrons from said drain and
means for applying a voltage to said control gate to transfer said electrons to said floating gate, said control gate voltage having an initial magnitude $V_1$ and rising to a second level $V_2$ at a rate $R$, wherein $V_1$ is equal to $V_p/\chi$, with $V_p$ being the floating gate voltage at which the channel hot electron injection current is at a maximum value for a given applied voltage to said drain, $\chi$ being the capacitive coupling factor between said control gate and said floating gate and $R$ being substantially equal to the maximum channel hot electron injection current divided by the capacitance between said floating and control gates for at least a portion of the duration of said applied control gate voltage.

11. A memory system comprising
a plurality of word lines,
a plurality of bit/sense lines arranged orthogonal to said word lines,
a plurality of cells, one of said cells being coupled to one of said word lines and to one of said bit/sense lines at each intersection of said word and bit/sense lines, each of said cells including a control gate, a floating gate and a source of charge coupled to said to said one bit/sense line, said floating gate exhibiting a charge current-voltage characteristic curve having a positive slope portion at low voltages, a negative slope portion at voltages higher than said low voltages and a zero slope portion at a given voltage disposed between said low and high voltages producing a given current flow to said floating gate, means for applying during a first time period of a given time cycle a first voltage to the control gate of a selected one of said cells producing substantially said given voltage on the floating gate of said selected cell to charge the floating gate of said selected cell with charge current from said source of charge, and means for applying during a second time period of said time cycle a second voltage having a magnitude greater than said first voltage to the control gate of said selected cell producing substantially said given voltage on said charged floating gate.

12. A memory system as set forth in claim 11 wherein said first and second voltage applying means are connected to said control gates through said word lines.

13. A memory system comprising
a plurality of word lines,
a plurality of bit/sense lines arranged orthogonal to said word lines,
a plurality of cells, one of said cells being coupled to one of said word lines and to one of said bit/sense lines at each intersection of said word and bit/sense lines, each of said cells including a control gate, a floating gate, a source of charge coupled to said one bit/sense line, said floating gate exhibiting a charge current-voltage characteristic curve having a positive slope portion at low voltages, a negative slope portion at voltages higher than said low voltages and a zero slope at a given voltage disposed between said low and high voltages producing a given current flow to said floating gate, and a transistor having a control electrode and coupled to said one bit/sense line through a respective one of said sources of charge, said control electrode being connected to said one word line, means for applying a first voltage to the control gate of a selected one of said cells producing substantially said given voltage on the floating gate of said selected cell to charge the floating gate of said selected cell with charge current from said source of charge, and means for applying a second voltage having a magnitude greater than said first voltage to the control gate of said selected cell producing substantially said given voltage on said charged floating gate.

14. A memory system as set forth in claim 13 further including a plurality of control lines, each of said control gates being connected to one of said control lines and said first and second voltage applying means being connected to said control gates through said control lines.

15. A method of programming a memory cell, having a control gate, a source of charge and a floating gate insulated from said control gate with a charge current-voltage characteristic curve having an injection limited region, a field limited region and a peak point having a given voltage at which maximum current flows from said source of charge to said floating gate, which includes the steps of applying during a first period of time of a given time cycle a first voltage of a given magnitude to said control gate producing a second voltage on said floating gate in said injection limited region for charging said floating gate until the voltage on said floating gate reaches said given voltage, and applying during a second period of time of said given time cycle a third voltage of a magnitude higher than that of said given magnitude to said control gate producing said second voltage on said charged floating gate in said injection limited region for further charging said floating gate until the voltage on said floating gate again reaches said given voltage.

16. A method as set forth in claim 15 wherein said third voltage is applied as a ramp voltage during period of time after said first voltage is applied to said control gate.

17. A memory cell comprising
a semiconductor substrate having spaced apart source and drain regions,
a control gate,
a floating gate insulated from said control gate and from said substrate so as to form a capacitive coupling factor therewith, said floating gate having a floating gate voltage-current characteristic wherein said current is maximum at a given floating gate voltage,
means for applying a voltage to said control gate providing substantially said given voltage to said floating gate, and
means for increasing said control gate voltage at a rate substantially equal to the decrease in voltage on said floating gate caused by current flow to said floating gate divided by said capacitive coupling factor.

* * * * *